(12) United States Patent
Borley et al.

(10) Patent No.: US 7,394,838 B2
(45) Date of Patent: Jul. 1, 2008

(54) CONTROL FOR A TUNABLE LASER

(75) Inventors: Steven James Borley, Towcester (GB); Andrew Cannon Carter, Blisworth (GB)

(73) Assignee: Bookham Technology, PLC, Towcester (GB)

( * ) Notice: Subject to any disclaimer, the term of this patent is extended or adjusted under 35 U.S.C. 154(b) by 387 days.

(21) Appl. No.: 10/506,001

(22) PCT Filed: Feb. 28, 2003

(86) PCT No.: PCT/GB03/00863

§ 371 (c)(1), (2), (4) Date: Aug. 27, 2004

(87) PCT Pub. No.: WO03/073569

PCT Pub. Date: Sep. 4, 2003

(65) Prior Publication Data

US 2006/0039420 A1    Feb. 23, 2006

(30) Foreign Application Priority Data

Feb. 28, 2002    (GB) .................................. 0204668.8

(51) Int. Cl.
*H01S 3/10*    (2006.01)
(52) U.S. Cl. ............................................ 372/20; 372/96
(58) Field of Classification Search .................. 372/39, 372/32, 50.11, 20, 29.02, 96
See application file for complete search history.

(56) References Cited

U.S. PATENT DOCUMENTS

| 4,813,054 A | | 3/1989 | Plumb |
| 4,829,535 A | * | 5/1989 | Utaka ....................... 372/50.11 |
| 5,379,318 A | * | 1/1995 | Weber .......................... 372/96 |

(Continued)

FOREIGN PATENT DOCUMENTS

EP    0 529 732    11/1994

(Continued)

OTHER PUBLICATIONS

Optical Fibre Communication Conference 2000, Mar. 7-10, 2000, vol. 2, pp. 338-340, "Fast and fine wavelength tuning of a GCSR laser using a digitally controlled driver," Fukashiro et al, see fig. 2a.

(Continued)

*Primary Examiner*—Minsun Harvey
*Assistant Examiner*—Tuan N. Nguyen
(74) *Attorney, Agent, or Firm*—Lahive & Cockfield, LLP; Anthony A. Laurentano, Esq.

(57) ABSTRACT

A control (20) and a method of controlling a tunable laser having a gain section (4), a phase change section (5) and a segmented Bragg grating reflector section (6) comprising a series of grating units (9-17) each of a different pitch, and an electrode (9a-17a) associated with each grating so that an electrical current is applicable to each individual grating. The control (20) includes a plurality of digitally controlled sources (31, 32) of electrical current which are each connected to switch means (33 or 35, 36) operable to independently connect each of said sources (31, 32) to a respective electrode (e.g. 11a or 12a) associated with a grating (e.g. 11 or 12) which is one of a subset of consecutive gratings (e.g. 11 & 12) selected from said series of grating units (9-17).

15 Claims, 2 Drawing Sheets

U.S. PATENT DOCUMENTS 5,581,572 A    12/1996  Delorme et al.
5,642,371 A *   6/1997  Tohyama et al. ......... 372/45.01
5,838,714 A * 11/1998  Delorme ...................... 372/96

FOREIGN PATENT DOCUMENTS

WO    WO-03/012936 A2    2/2003

OTHER PUBLICATIONS

Journal of Lightwave Technology, Jul. 1999, vol. 17, issue 7, pp. 1222-1228, "A high-speed mixed digital-to-analog circuit board for accurate control of wavelength tunable lasers for fibre-optic communications," Biernacki et al, see fig 3.

* cited by examiner

US 7,394,838 B2

CONTROL FOR A TUNABLE LASER

RELATED APPLICATIONS

This application is a 35 U.S.C. 371 national stage filing of International Application No. PCT/GB03/00863, filed 28 Feb. 2003, which claims priority to Great Britain Patent Application No. 0204668.8 filed on 28 Feb. 2002, in Great Britain. The contents of the aforementioned applications are hereby incorporated by reference.

FIELD

This invention provides a control for a tunable laser particularly for use in telecommunication systems.

BACKGROUND OF THE INVENTION

Tunable lasers for use in optical communications systems, particularly in connection with wavelength division multiplex (WDM) telecommunication systems, are known. A known tunable system comprises stacks of single wavelength distributed Bragg reflectors (DBR) lasers, which can be individually selected; or tuned over a narrow range, or by a wide range tunable laser that can be electronically driven to provide the wavelength required. Limited tuning range tunable lasers that rely upon thermal effects for tuning are also known.

A typical optical fibre telecommunications band is the 1550 nm C-band, located in the infra-red spectrum with International Telecommunication Union (YrU) 200, 100 or 50 GHz channel spacing (the so-called ITU Grid) spread between 191 THz and 197 THz.

U.S. Pat. No. 4,896,325 discloses a wavelength tunable laser having sampled gratings at the front and rear of its gain region. The laser described in that specification relies on the use of two different gratings which produce slightly different reflection combs in the front and rear gratings. These provide feedback into the device. The gratings can be current tuned in wavelength with respect to each other. Co-incidence of a maximum from each of the front and rear gratings is referred to as a supermode. To switch the device between supermodes requires a small incremental electrical current into one of the gatings to cause a different pair of maxima to coincide in the manner of a vernier. By applying electrical currents to the two gratings so that the corresponding maxima track, continuous tuning within a supermode can be achieved.

Alternative forms of electrically tunable comb reflection gratings are commonly known as superstructure gratings such as described in "Broad-Range Wavelength-Tunable Superstructure Grating (SSG) DBR Lasers", Y Thomori et al, IEEE Photonics Technical Letters, Volume 5, No. 6, Jul. 1993.

The applicant's co-pending UK application 0106790.9 discloses a tunable laser having a gain section, a phase section and a segmented Bragg grating reflector comprising a series of grating units, at least two of which have a different pitch, wherein an electrical current is applicable to the grating having a longer pitch such that the wavelength of the longer pitch grating can be tuned to the wavelength of the shorter pitch grating.

Another tunable laser is disclosed in the applicant's copending UK application 0118412.6 in which there is disclosed a tunable laser including a gain section bounded at one end by a first reflector in the form of a distributed Bragg grating reflector producing a first comb of reflective peaks and on the other end by a second reflector in the form of a segmented distributed Bragg grating reflector with each segment capable of producing a peak corresponding to one of the peaks in the first comb, some at least of the segments in the segmented distributed Bragg grating reflector being capable of modification so as to reflect light at the wavelength of another peak so as to form a reinforced peak, so that the laser is capable of lasing at the wavelength of the reinforced peaks.

The segmented distributed Bragg grating reflector comprises a plurality of segments, typically eight or nine, each comprising gratings, the different segments having a grating which may be each of different pitch and their preferred organization being the longest pitch is at the facet end of the reflector, and the shortest pitch is closest to the gain section, with progressive pitch size change therebetween.

The segments are modified to change the reflecting wavelength by altering the refractive index of the material of which the segments are formed, and the refractive index may be varied by passing an electrical current through the segments. Each segment has an associated electrode to permit the passage of current through the segment arid each electrode is actuable independently of the other electrodes.

The common method of controlling multi-section lasers is to provide one digitally controlled current source per electrode and it is common to implement each current source digitally using a digital-to-analogue-converter (DAC). However for a tunable laser having multiple sections and a plurality of independently actuable grating segments, to provide one digitally controlled DAC per section or segment has major disadvantages in circuit size, control complexity and consequential costs.

It is an object of the present invention to provide a suitable control for a tunable laser having a segmented distributed Bragg grating reflector, which ameliorates these problems.

STATEMENT OF THE INVENTION

According to the invention there is provided a control for a tunable laser having a gain section, a comb reflection section, a phase change section and a segmented Bragg grating reflector section comprising a series of grating units each of a different pitch, and an electrode associated with each grating so that an electrical current is applicable to each individual grating, wherein the control includes a plurality of controlled sources of electrical current which are each connected to switch means operable to independently connect each of said sources to a respective grating being one of a subset of consecutive gratings selected from said series of grating units.

Each subset comprises 'N' gratings and each source may be connected to a respective switch means having a plurality of output terminals each being respectively connectable to every Nth gratings in said series of grating units. The respective switch means preferably each comprise a multi-channel, preferably four channel, multiplexer. The multiplexers may be each controlled by an embedded controllers, preferably a micro-processor, digital signal processor, or look-up table, operable via an interface means; preferably a N-wire interface having a maximum of 2*n (two to the power of n) output channels, or a serial control interface with encoded address data, that defines the active path within the multiplexer.

Also according to the invention, there is provided a tunable laser having a gain section, a phase change section and a segmented Bragg grating reflector section comprising a series of grating units each of a different pitch, and an electrode associated with each grating so that an electrical current is applicable to each individual grating, and a control according to the first aspect of the present invention, the control activating at least one of a subset of consecutive gratings so as to reflect light at a wavelength of another peak to form a reinforced peak so that the laser is capable of lasing at the wavelength of the reinforced peak.

In this specification the term "light" will be used in the sense that it is used in optical systems to mean not just visible light but also electromagnetic radiation having a wavelength between 700 nanometres (nm) and 3000 nm.

Preferably the gain section of the laser is bounded at one end by a segmented Bragg grating reflector and its other end by a phase change section, which on its other side is, bounded by comb refection section, conveniently in the form of a distributed Bragg grating reflector producing a comb of reflective peaks.

Preferably, the distributed Bragg grating reflector is a phase grating distributed Bragg reflector of the type disclosed in GB 2337135.

Alternatively, the distributed Bragg grating reflector is a superstructure grating reflector, of the type described in "Broad-Range Wavelength Tunable Superstructure Grating (SSG) DBR Lasers", Y Thomori et al., IEEE Photonics Technical Letters, Volume 5, No. 6, July 1993.

Alternatively, the distributed Bragg grating reflector is a sampled grating Bragg reflector of the type described in U.S. Pat. No. 4,896,325.

In a preferred embodiment, the Bragg grating segments are each kept short so that the cumulative waveguide length associated with the Bragg gratings is minimised, thereby keeping the waveguide attenuation losses low. With short Bragg grating segments the associated reflectivity of each is broad and this causes a degree of overlap between neighbouring segment reflectivity. However, by appropriate design the segment reflectivity discrimination can be sufficient for stable lasing operation in combination with reduced light power losses.

The grating comprising the distributed Bragg grating reflector is made long so that its comb reflection peaks have finesse and constitute well defined wavelengths. These comb wavelengths are typically centred on channels in the communications band of interest.

Electrical current passing through the distributed Bragg reflector alters the wavelengths at which the comb of reflecting peaks reflects.

Electrical current passing through the phase change section alters the refractive index of the material of the phase change section to effect the phase and thereby minimise mode hopping.

Tunable lasers are suitable for use in telecommunications systems, for example, in the C-band, namely within the band 1530 nm to 1570 nm.

According to another aspect of the invention there is provided a method of control for a tunable laser having a gain section, a phase change section and a segmented Bragg grating reflector section comprising a series of grating units each of a different pitch, with an electrode associated with each grating so that an electrical current is applicable to each individual grating to vary its refractive index, wherein said method includes providing a plurality of controlled sources of electrical current, connecting the sources to switch means, and operating the switch means to independently connect each of said sources to one of a subset of consecutive gratings selected from said series of grating units.

Preferably the laser is provide with a comb reflection section and passing an electrical current through the comb reflection section alters the wavelengths at which the comb of its reflecting peaks reflects.

Preferably, the laser emits light through the segmented distributed Bragg grating reflector and end facet.

DESCRIPTION OF THE DRAWINGS

The invention will be described by way of example and reference to the accompanying drawings in which.

DETAILED DESCRIPTION OF THE INVENTION

The invention will be described by reference to a tunable laser as is described in UK patent application 0118412.6, which will be described herein only as is sufficient for an understanding of the present invention.

Common reference numbering has been used across all Figures for drawing elements with equivalent functionality.

Figure 1:
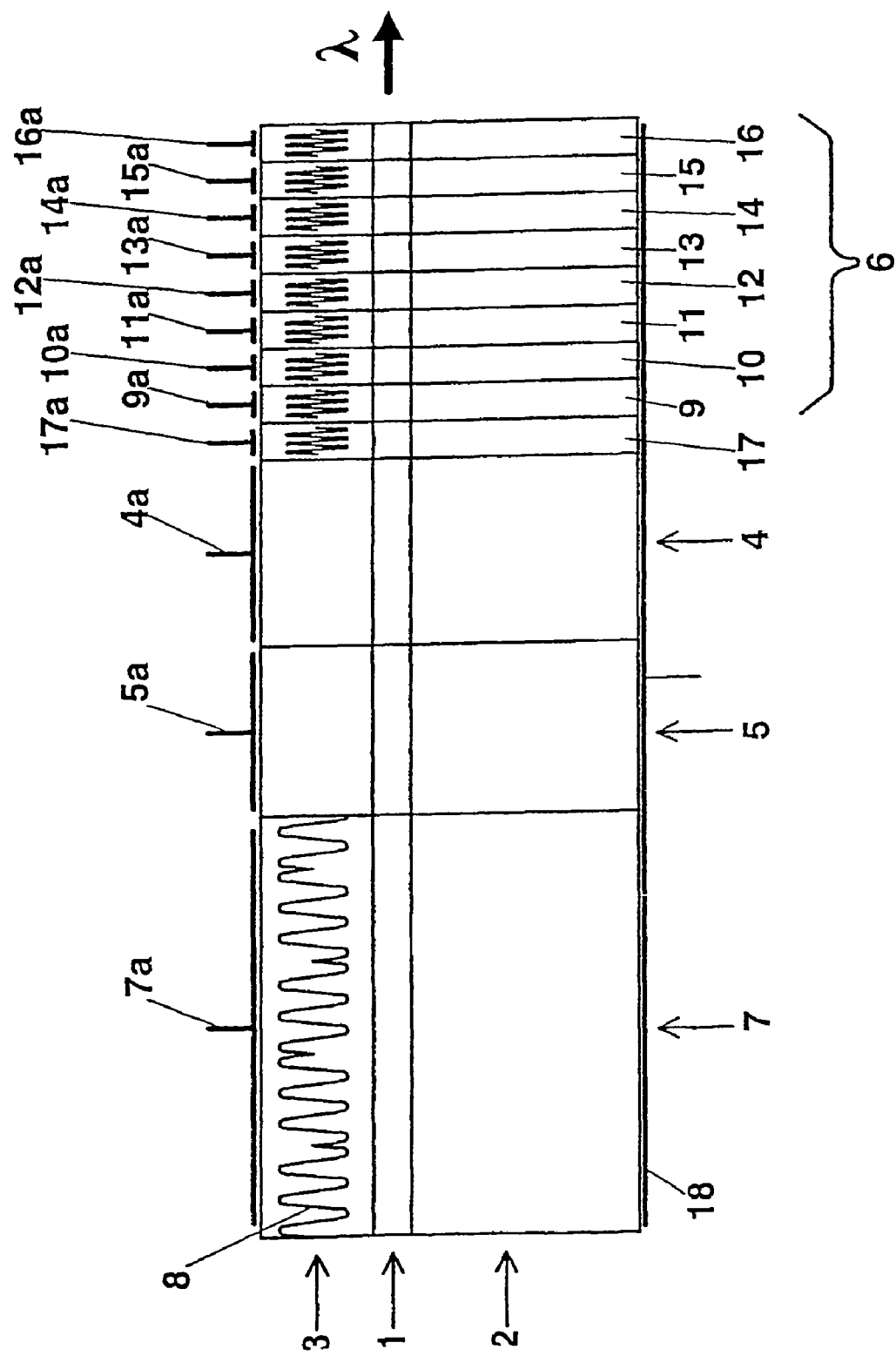
FIG. 1 is a schematic cross section through a laser suitable for operation in association with a control according to the present invention.

Referring to FIG. 1, this shows a schematic cross sectional view of a laser in accordance with the present invention. As is conventional in semiconductor lasers the laser is built up in a series of layers, with an active layer 1 formed between a lower layer 2 and an upper layer 3. There will typically be a plurality of layers in the structure, but they are not material to the invention and for better understanding of the invention they are not shown. The active layer 1 also acts as a waveguide.

The laser itself has four principal sections. A gain section 4, a phase change section 5 and front and rear reflecting section 6 and 7 respectively. The rear reflecting section 7 has a phase grating distributed Bragg grating reflector 8 formed in the layer 3. Such a reflector produces a comb of reflectance peaks at separated wavelengths, and each peak is of substantially the same amplitude. The front reflector 6 is made up of a series of segments 9-17, each segment being a distributed Bragg grating reflector unit, but each segment reflecting at nominally a single wavelength only. The wavelengths of the individual peaks of the segments 9 to 15, and 17, corresponding to one of the peaks of the comb reflectance produced by the front reflector Bragg grating reflector.

A common electrode 18 acts as the electrical return for the semiconductor laser device.

Each of the sections 4, 5, 7, and segments 9-17 is provided with an associated electrode 4a, 5a, 7a, 9a-17a through which electric current can be applied to the respective section or segment. Grating unit 17 does not of necessity have to have an associated electrode 17a, as its function is to form a lowest wavelength (band edge) down to which the next highest wavelength unit may be tuned.

The material of which layer 3 is formed in the sections corresponding to the reflectors 6 and 7, is such as to experience a reduction in refractive index when an electrical current is passed through it—the so-called electro-refractive effect. When light passes through a medium of refractive index $n_{eff}$ the actual wavelength of the light within that medium, which will be referred to herein as $\lambda^1$, is the wavelength $\lambda$ divided by the value for the refractive index $n_{eff}$. In other words:—

$$\lambda^1 = \lambda/n_{eff} \quad (1)$$

where $n_{eff}$ is the effective refractive index of the medium as seen by the propagating light of wavelength $\lambda$ in free space.

Thus if, for example, a current is passed through the electrode 12a, the wavelength at which the Bragg reflector in segment 12 reflects light will be reduced. If the reduction is such that it now reflects light at the-same wavelength as the Bragg grating reflector of the adjacent lower wavelength segment, segment 11, then the intensity of the peak for segment 11 is reinforced such that it is much higher and more intense than the other reflection peaks.

Now, however, if a current is passed through the electrode 4a to create light in the gain section 4, at an intensity above the lasing threshold, the light at the wavelength corresponding to the reinforced intensity segment peak is preferentially operable and the laser will commence to lase at that wavelength. Thus the laser will be tuned to that wavelength. If a current is now passed through electrode 7a this will effectively move the whole comb of peaks for that reflector to lower wavelengths. If at the same time a current is passed through electrode 11a and the current passing through electrode 12a are increased, then the reinforced peak will also move to a lower wavelength.

Figure 2:
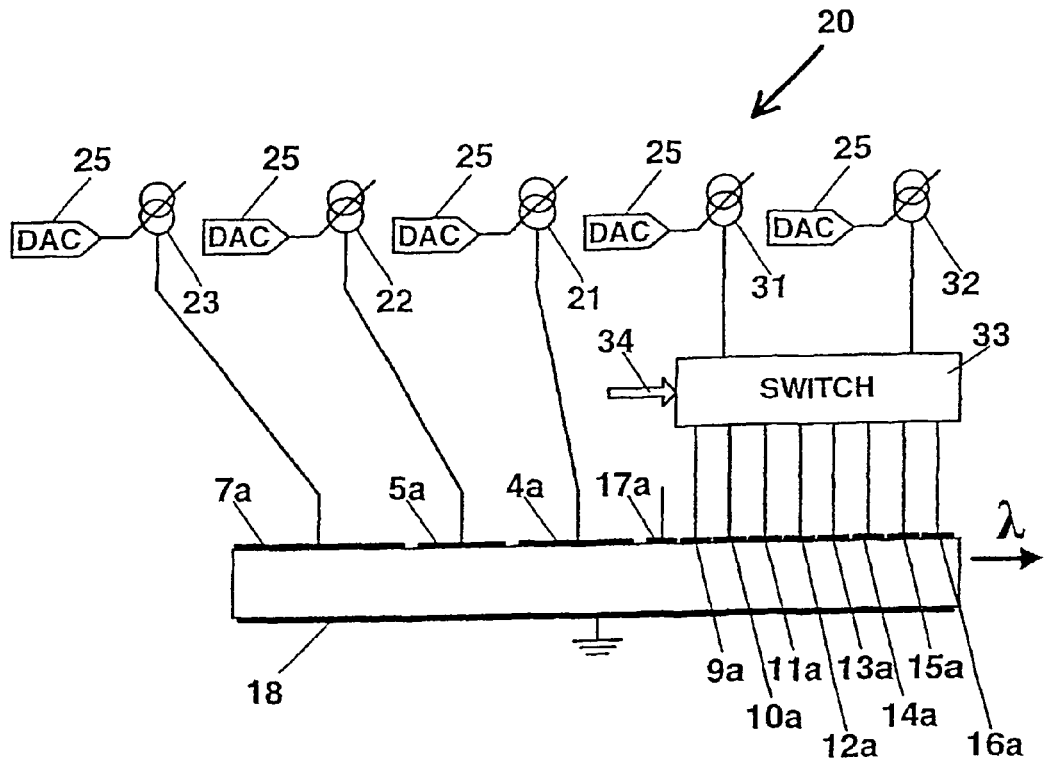
FIG. 2 is a schematic drawing of a laser as shown in FIG. 1 having a first control system according to the present invention.

With reference now to FIG. 2, in order to supply an electrical current to different sections and selected pairs of adjacent Bragg grating segments a control arrangement 20 is required. Control arrangement 20 provides one digitally controlled current source 21, 22, 23 per electrode 4a, 5a, 7a and each current source is controlled digitally using a respective DAC 25. An exemplary DAC is supplied by Analog Devices Inc., type AD5324, which is a quad 12 bit DAC.

Since in the segmented distributed Bragg reflector section 6, of FIG. 1, only two adjacent grating segments e.g. 11 and 12, are activated at any one time this section is operated through only two current sources 31 and 32, which are again each implemented using a respective DAC 25. The two digitally controlled sources of electrical current 31 and 32 are each connected to switch means 33. The switch means 33 is connected to the electrodes 9a-16a and is operable to independently connect each of said sources 31 and 32 to one of two adjacent gratings e.g. 11 and 12, selected from said series of gratings 9-16 A suitable switch 33 may be a linear commutator. The switch means 33 may be operated by a control 34, which one of ordinary skill will appreciate may be from a programmable controller (not shown) which also controls the DACs 25.

Figure 3:
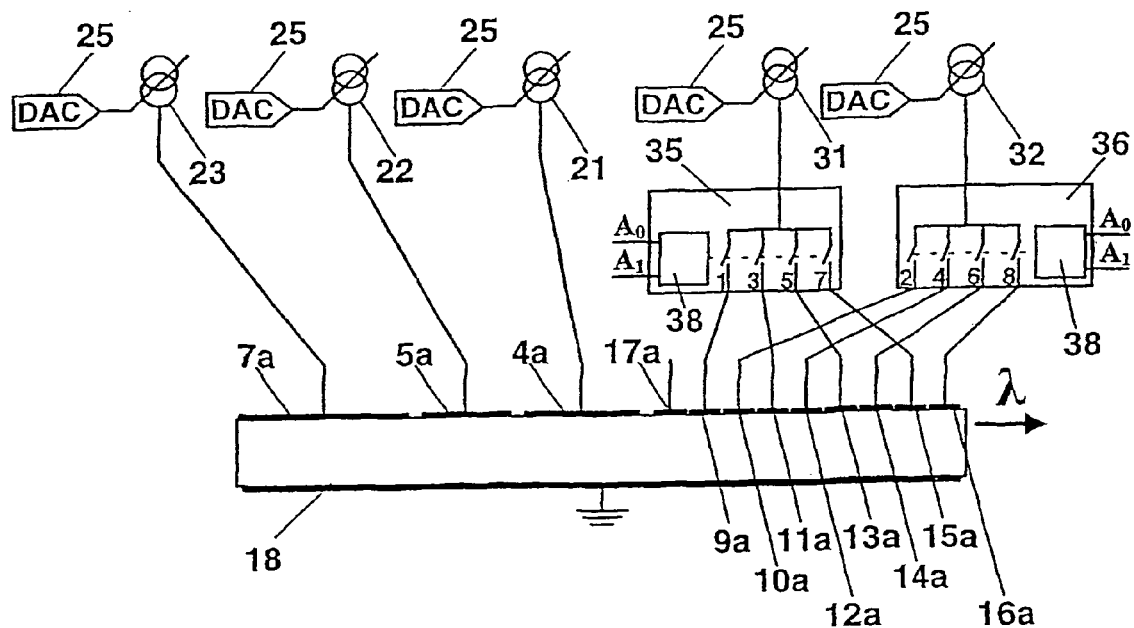
FIG. 3 is a schematic drawing of a laser as shown in FIG. 1 with a second control system according to the present invention.

With reference now to FIG. 3, each current source 31 and 32 is connected to one of a pair of 4-way multiplexers 35 and 36 respectively. As an example, a suitable multiplexer is a MAX4634 available from Maxim Integrated Products. Each multiplexer 35, 36 has four outputs that are singularly connected to alternate electrodes of the segmented Bragg grating section as shown in FIG. 3, i.e. 35 is connected to alternate electrodes 9a, 11a, 13a, 15a and 36 is connected to alternate electrodes 10a, 12a, 14a and 16a, so that pairs of adjacent segments can be concurrently activated with current. Each multiplexer 35, 36 is controlled via a 2-wire interface ($A_0$ and $A_1$) that defines the active path within the multiplexer and hence which segment receives current. This interface may be provided with an embedded micro-controller 38. To change the laser wavelength and/or channel the micro-controllers 38 configure the multiplexers according to Tables 1 and 2 below:—

TABLE 1

| | ACTIVE SWITCH | | | |
|---|---|---|---|---|
| | O/P | | | |
| | 1 | 3 | 5 | 7 |
| $A_0$ | L | H | L | H |
| $A_1$ | L | L | H | H |

TABLE 2

| | ACTIVE SWITCH | | | |
|---|---|---|---|---|
| | O/P | | | |
| | 2 | 4 | 6 | 8 |
| $A_0$ | L | H | L | H |
| $A_1$ | L | L | H | H |

In Table 1 and 2 L=Logical Low, H=Logical High, and output (O/P) numbers correspond with those given on FIG. 3.

The two multiplexers therefore have unique switch settings for adjacent pairs of activated Bragg grating segments as is shown in Table 3 below:—

TABLE 3

| | MULTIPLEXER 35 | | MULTIPLEXER 36 | |
|---|---|---|---|---|
| PAIR | $A_0$ | $A_1$ | $A_0$ | $A_1$ |
| 1 & 2 | L | L | L | L |
| 2 & 3 | H | L | L | L |
| 3 & 4 | H | L | H | L |
| 4 & 5 | L | H | H | L |
| 5 & 6 | L | H | L | H |
| 6 & 7 | H | H | L | H |
| 7 & 8 | H | H | H | H |

In Table 3, L=Logical Low, H=Logical High

The multiplexer micro-processors 38, and the DACs 25, are controlled by a programmable controller, not shown, to produce the required operating wavelength.

In many telecommunication applications the tunable laser will be required to operate on ITU Grid channels for which a look-up table, not shown, may be used to set the control means to the required condition, and the laser thereby switched between channels. Alternative applications may require the laser to be continuously tunable for which applications the programmable controller may be dynamically driven using variable controls not shown, but of an obvious nature to those of ordinary skill in the art.

The invention claimed is:

1. A control for a tunable laser having a first reflecting section, a gain section, a phase change section and a second reflecting section comprising a segmented Bragg grating section having a series 'P' adjacent grating units having a progressive pitch size change from one end of the series to other end, and an electrode associated with each grating unit so that an electrical current is applicable to each individual grating unit, comprising a plurality of digitally controlled sources of electrical current which are each connected to a switch operable to independently connect each of said plurality of sources to a respective one grating unit of a subset only of 'N' consecutive adjacent grating units selected from said series of grating units, wherein 'P' is greater than 'N', and 'N'>1.

2. A control as claimed in claim 1, wherein said 'N' grating units and each source of electric current is connected to a respective switch having a plurality of output terminals each being respectively connectable to every Nth grating unit in said series of grating units.

3. A control as claimed in claim 2, wherein said switch comprise a multi-channel multiplexer.

4. A control as claimed in claim 3, wherein said multiplexer is controlled by an embedded controller operable via an interface that defines an active path within the multiplexer.

5. A control as claimed in claim 2, wherein 'N' is two and Nth is second.

6. A control as claimed in any claim 1, comprising two digitally controlled sources of electrical current, and wherein the switch is operable to connect said sources to one of two adjacent grating units forming a subset.

7. A control a claimed in claim 6, wherein said switch comprises a four channel multiplexer.

8. A tunable laser comprising a first reflecting section, a gain section, a phase change section, a second reflecting section comprising a segmented Bragg grating reflector having a series 'P' adjacent grating units having a progressive pitch size change from one end of the series to other end, an electrode associated with each grating unit so that an electrical current is applicable to each grating unit, and a control comprising a plurality of digitally controlled sources of electrical current which are each connected to a switch operable to independently connect each of said plurality of sources to a respective one grating unit of a subset only of consecutive grating units selected from said series of grating units, the control activating at least one of a pair of 'N' consecutive adjacent grating units so as to reflect light at a wavelength of another peak to form a reinforced peak so that the laser is capable of lasing at the wavelength of the reinforced peak, wherein 'P' is greater than 'N', and 'N'>1.

9. A laser as claimed in claim 8, wherein the gain section is bounded at one end by the segmented Bragg grating reflector and at the other end by the phase change section, wherein an opposite side of the phase change section is bounded by a comb reflection section producing a comb of reflective peaks.

10. A laser as claimed in claim 9, wherein the comb reflection section comprises a phase grating distributed Bragg reflector.

11. A laser as claimed in claim 9, wherein the comb reflection section comprises a sampled grating Bragg reflector.

12. A laser as claimed in claim 9, wherein the comb reflection section comprises a superstructure grating reflector.

13. A method of control for a tunable laser having a first reflecting section, a gain section, a phase change section and a second reflecting section comprising a segmented Bragg grating reflector having a series 'P' grating units having a progressive pitch size change from one end of the series to other end, with an electrode associated with each grating unit so that an electrical current is applicable to each individual grating unit to vary a refractive index, wherein said method comprises providing a plurality of digitally controlled sources of electrical current, connecting each of the plurality of sources to a switch, and operating said switch to independently connect each of said sources to a respective grating unit being one of a subset only of 'N' adjacent grating units selected from said series of grating units, wherein 'P' is greater than 'N', and 'N'>1.

14. A method as claimed in claim 13, further comprising the laser providing at an end away from the segmented Bragg grating reflector section with a distributed Bragg grating reflector wit an associated electrode, and passing an electrical current through the distributed Bragg grating reflector to alter one or more wavelengths at which the comb of its reflecting peaks reflects.

15. A method as claimed in claim 13, further comprising passing electric current through the phase change section to alters a refractive index of the material of the phase change section to affect a phase and thereby minimize mode hoping.

* * * * *